United States Patent [19]

Schneider

[11] 4,001,728
[45] Jan. 4, 1977

[54] DIGITAL METHOD OF PULSE WIDTH MODULATION

[75] Inventor: Wolfger Schneider, Columbia, Md.

[73] Assignee: The United States of America as represented by the Secretary of the Navy, Washington, D.C.

[22] Filed: Feb. 27, 1974

[21] Appl. No.: 446,258

[52] U.S. Cl. .............................. 332/1; 325/38 R; 332/9 R; 329/106; 340/347 AD
[51] Int. Cl.² ...................................... H03K 7/08
[58] Field of Search ............ 332/9 R, 9 T, 1, 11 R, 332/11 D; 325/38 R, 38 B, 38 A; 340/347 AD; 329/106

[56] References Cited
UNITED STATES PATENTS

| | | | |
|---|---|---|---|
| 3,249,895 | 5/1966 | Corney | 328/149 X |
| 3,440,566 | 4/1969 | Swanson | 332/9 T |
| 3,478,170 | 11/1969 | Hanni | 325/38 R X |
| 3,668,560 | 6/1972 | Padalino | 332/9 R |
| 3,699,566 | 10/1972 | Schindler | 332/11 D |
| 3,737,897 | 6/1973 | Cuthbert et al. | 340/347 AD |

*Primary Examiner*—John Kominski

[57] ABSTRACT

Disclosed is a method of encoding information in a pulse width modulated signal using totally digital techniques. An incremental ramp wave is utilized as a modulation reference, and intercepts between the modulation reference and a signal to be encoded are detected and/or predicted logically by examining the values of these two signals at predetermined intervals.

4 Claims, 9 Drawing Figures

DIGITAL METHOD OF PULSE WIDTH MODULATION

BACKGROUND OF THE INVENTION

The present invention relates to a method of producing a pulse width modulated signal, and more particularly to a method of producing such signal using only digital techniques and digital apparatus.

Pulse width modulation of an electrical signal is a common method of encoding information. This type of modulated signal is often used to drive some sort of electromotive power unit, such as a servo-motor. A typical system might employ a servo-motor, driven by such signal, to control; a manufacturing process, the flight of an airplane, or some other real-time event. This type of servo-control is extensively employed in many drone environments; i.e., those in which no operator is actually present, such as guided missiles or the like. An early pulse width modulation system used on guided missiles simply combined an analog ramp wave with an analog command signal received from an autopilot. With the advent of more sophisticated electronic apparatus and the general trend toward digitalization, this analog method became less and less compatible with the rest of the overall system. However, totally digital systems have proved less than perfect, with such imperfections evidenced by a lack of smooth airframe response, resolution deficiencies and inexactitudes in the performance of command signals.

To further show some of the problems presented by a totally digital system, a prior hybrid (analog and digital) system might be examined. To pulse width modulate a command signal, say, a digital one at some frequency $f_m$, this command signal may be compared to a modulation reference wave having a typical period of $1/f_m$. A typical system employs an analog ramp wave as the modulation reference and a comparator to indicate when both waves are of equal value, i.e., when one wave crosses the other. Each time the comparator detects such crossing a binary command may be sent to an on-off actuator connected to the particular servo-mechanism under control. No resultant command signal errors will be introduced whether the initial command signal is in analog or digital form, provided the modulation reference is an analog signal. However, when the modulation reference wave is in digital form and the command signal is in digital form, resolution problems arise. A typical digital modulation reference signal might consist of a series of discrete steps of increasing amplitude arranged to approximate an analog ramp wave. In other words, instead of the modulation reference being a smooth wave it is more like a staircase wave. In this case, when the command signal intercepts the reference wave and the comparator indicates that the waves are of equal value, the indicated actual point of intercept will lead or lag (in time) the ideal intercept point obtained by use of an analog ramp wave.

Therefore, it is an object of the invention to provide a digital method of pulse width modulation.

It is a further object of the invention to provide a digital pulse width modulation method having an effective resolution which is not primarily determined by the ratio of computational frequency to modulation frequency.

It is a still further object of the invention to provide a digital pulse width modulation method capable of being performed on a general purpose digital computer.

SUMMARY OF THE INVENTION

To eliminate the intercept uncertainty which obtains when utilizing a digital wave, composed of a number of steps, as a modulation reference wave, the invention provides a method to calculate the ideal intercept points. If an intercept is seen to occur between the $(n^{th})$ and $(n^{th} + 1)$ steps of the digital modulation reference (incremental ramp wave) the exact time of the ideal intercept may be computed.

Regarding the effective resolution problem, assume a typical autopilot has a computation frequency of $f_c$ and a pulse width modulation frequency of $f_m$. If this autopilot is capable of giving only binary commands at the modulation frequency $f_m$, which do not vary in phase, then the intrinsic resolution of the method of modulation of this example is given by:

$$r_i = f_c/2f_m \qquad (1)$$

Of course $f_c$ will be greater than $f_m$, and for practical values of $f_c$ and $f_m$ if the intrinsic resolution lies between 2 and 10, unsatisfactory airframe response will result. In the method of this invention, whereby the ideal intercept is calculated rather than actually detected, the following information must be known: the value of the command signal for the $n^{th}$ interval, the value of the incremental modulation reference at the $(n^{th})$ and $(n^{th} + 1)$ interval, and the desired resolution required for each sampling interval. Assuming that each sampling interval is divided into $2^n$ parts, the effective resolution of the proposed method would be:

$$r_e = 2^n r_i = 2^n f_c/2f_m = 2^{(n-1)} f_c/f_m \qquad (2)$$

Accordingly, the method of the present invention accepts a digital command signal, develops an incremental modulation reference, then checks to see if an intercept has occurred between the modulation reference and the command signal during the $(n^{th})$ and $(n^{th} + 1)$ intervals. If it does occur, a properly scaled number will be computed having a value proportional to the time of intercept. Also, if an intercept should have occurred in the $(n^{th})$ interval but was not detected, then we should advance into the $(n^{th} + 1)$ interval and again compute a number proportional to the ideal time of intercept.

DESCRIPTION OF THE PREFERRED EMBODIMENT

Figure 1:
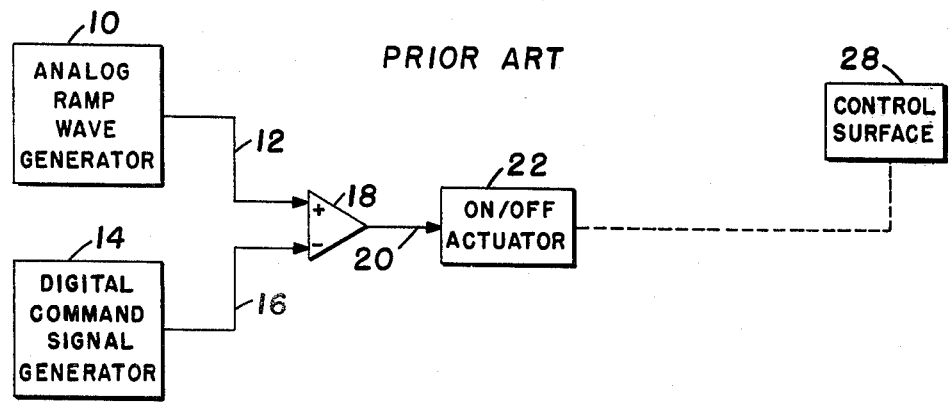
FIG. 1 is a block diagram of a prior art hybrid (analog and digital) pulse width modulation system.

With reference to FIG. 1 which shows a typical application using a pulse width modulated signal produced by a hybrid (analog and digital) system, a conventional ramp wave generator 10 is used to produce an analog ramp wave signal on line 12, and a digital command signal generator 14 produces a signal on line 16 containing the information to be encoded. These signals, on lines 12 and 16, are fed to a conventional comparator 18 which detects when the two signals intersect and produces an output signal on line 20. This signal, which is now pulse width modulated, is then fed to a conventional ON/OFF actuator 22. The ON/OFF actuator 22 is mechanically connected to the device desired to be controlled, which might be, for example, an airplane or missile control surface 28. This shows how a command signal containing information can be modulated to perform the actual control function. This type of system will produce no appreciable resolution problems nor accuracy errors due to the modulation ramp.

Figure 2:
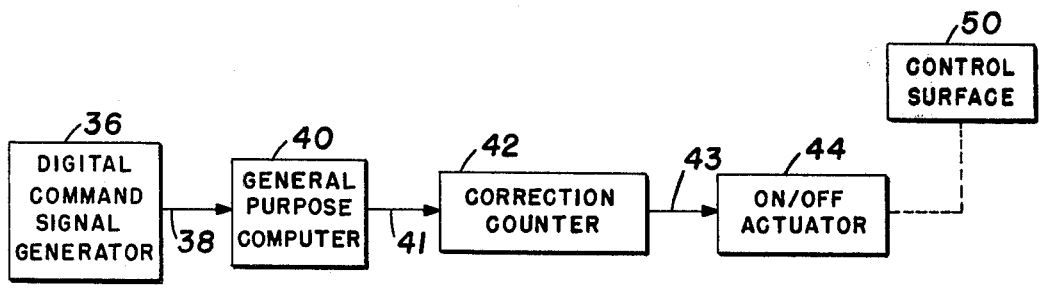
FIG. 2 is a block diagram of a digital pulse width modulation system utilizing the method of the present invention.
Figure 9:
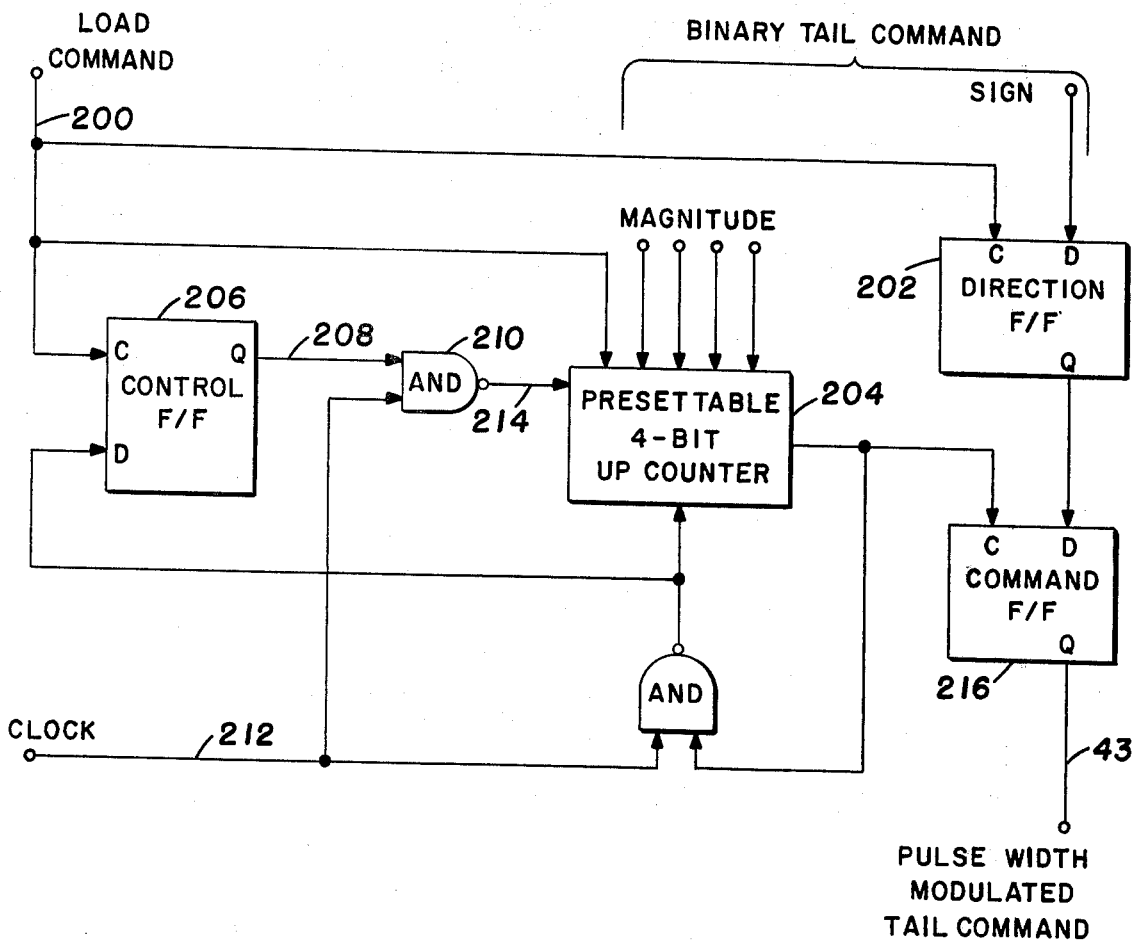
FIG. 9 is a schematic diagram of a correction counter as utilized in the embodiment of FIG. 2.

A block diagram of a digital pulse width modulation system is shown in FIG. 2. A digital command generator 36 is again used to provide a signal on line 38 containing the information to be encoded, but the analog ramp wave is now a digital incremental ramp wave supplied by a general purpose computer 40. To avoid overloading the computer with the production of an incremental ramp wave that approaches the resolution of an analog ramp wave, the incremental ramp wave is necessarily coarse in resolution. The digital command signal on line 38 is fed to the general purpose computer 40 or digital processor or the like which has been programmed in accordance with the method of the instant invention. Any of several wellknown general purpose digital computers, such as the Honeywell DDP-316 for example, may be used to implement the proposed digital pulse width modulation process. It may not be necessary to employ a separate digital command signal generator 36, if the general purpose computer 40 is of sufficient size. It is a relatively simple matter to program a general purpose computer to generate the digital command signal, shown here for clarity on line 38. The signal on line 41, which is now pulse width modulated, and which has been produced by the method of the invention may then be fed to a correction counter 42 which serves to correct the timing of the command signal. The correction counter 42 is a special purpose digital output device serving as a programmable clock and producing an output signal on line 43 which is readily acceptable by an ON/OFF actuator 44. The correction counter 42 of the preferred embodiment is described in more detail in FIG. 9. However, if the general purpose computer 40 contains a real-time clock that can operate on an interrupt basis, then the apparatus of FIG. 9 is not required. The ON/OFF actuator 44 is mechanically connected to a control surface 50 or the like which operates in accordance with the information contained in the pulse width modulated signal on line 42.

To better understand the manner in which the desired signals are produced by the systems of FIGS. 1 and 2 attention is now turned to FIGS. 3, 4, 5, 6 and 7.

Figure 3:
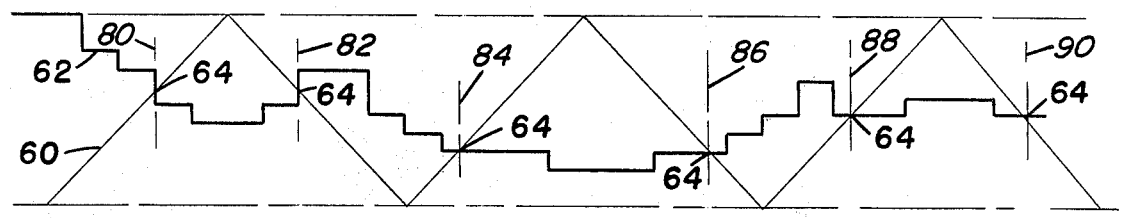
FIG. 3 is a plot of an analog modulation reference waveform and a digital command signal waveform.
Figure 4:
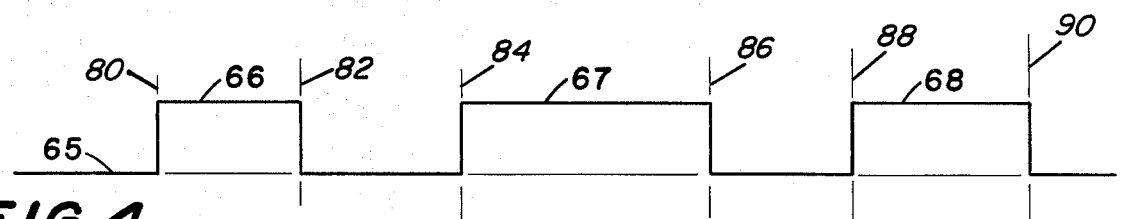
FIG. 4 is a waveform of the resultant pulse width modulated signal formed by the signals in FIG. 3.

The waveforms of FIGS. 3 and 4 are those associated with the conventional hybrid method of pulse width modulation shown in FIG. 1. Waveform 60 is an analog ramp wave and waveform 62 represents a digital command signal, these waves are compared and their intercept points 64 are detected and used to produce the resultant pulse width modulated signal. FIG. 4 is a plot of the resultant pulse width modulated waveform 65, with the pulses being indicated respectively at 66, 67, and 68. The axis of FIG. 4 corresponds in time with the axis of FIG. 3.

Figure 5:
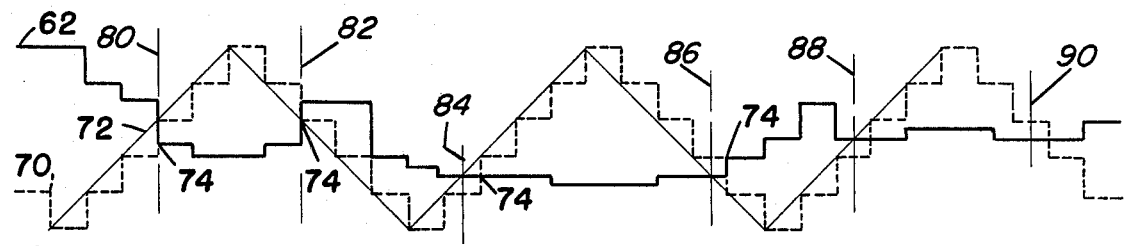
FIG. 5 is a plot of a digital modulation reference waveform and a digital command signal waveform.

Referring now to FIG. 5 the waveforms of a totally digital system, as shown in FIG. 2, are plotted on the same time base as FIGS. 3 and 4. An incremental ramp wave 70 is shown as a dotted line and is an approximation of an analog ramp wave 72 which is shown as a light solid line. The digital command signal 62 is shown again as in FIG. 3. The intercept points 74 between the two signals 70 and 62 may or may not be identical to those points of intercept 64 between the analog ramp wave and the digital command signal. Therein reside the errors discussed above. In order to better show the errors or inaccurate intercept points which obtain when using an all digital system, FIG. 6 is referred to.

Figure 6:
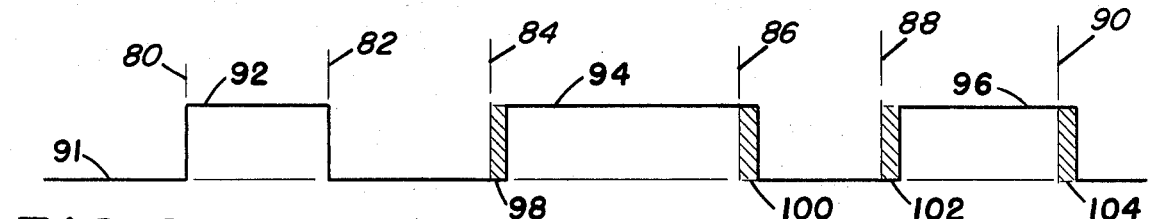
FIG. 6 is a waveform of the resultant pulse width modulated signal formed by the signals of FIG. 5.

FIG. 6 is placed in the same time reference as FIGS. 3, 4 and 5. The exact points of intercept obtained in FIG. 3, and hence the exact modulation of the digital signal, are shown in relation to all the figures by the vertical dashed lines 80, 82, 84, 86, 88, 90. These dashed lines are superimposed on the actual resultant signal 91 produced by the totally digital system of FIG. 2, the waveforms of which are shown in FIG. 5. If the pulses of FIG. 6, 92, 94, 96 have been accurately produced they will correspond exactly with pulses 66, 67, and 68 of FIG. 4. The dashed lines 80, 82, 84, 86, 88 and 90 will show where possible errors reside. As mentioned earlier, it is possible that a digital system will produce an accurate pulse, such as that which occurred in pulse 92, as can be seen from dashed lines 80 and 82. Pulse 94, however, does not line up with the correctly produced pulse 67. The pulse 94 is displaced in time as can be seen by the shaded areas 98 and 100. Similarly, the pulse 96 also is displaced in time from the true pulse 68, this is shown by the shaded areas 102 and 104. It is these errors, represented by the shaded areas 98, 100, 102, and 104, which the method of the subject invention eliminates.

Figure 7:
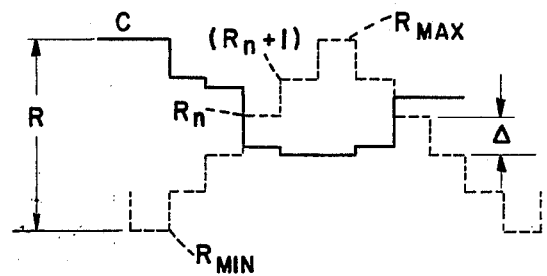
FIG. 7 shows a portion of the digital modulation waveform.

FIG. 7 shows a portion of the digital incremental ramp wave, shown as dotted line 70 in FIG. 5, with its critical points or values labelled. $R_{min}$ is the minimum ramp wave value, $R_{max}$ is the maximum ramp wave value, and $\Delta$ represents the incremental increase per time unit of the ramp wave, in either increasing or decreasing direction. $R_n$ indicates some particular point of interest on the ramp wave, and $(R_n + 1)$ indicates the point immediately following $R_n$ on the ramp wave. Note that $(R_n + 1)$ follows $R_n$ in time only, and does not indicate the amplitude of the wave, i.e., it will not indicate that the ramp is increasing or decreasing. A digital command signal C, represented as 62 in FIGS. 3 and 5, is also shown.

Figure 8:
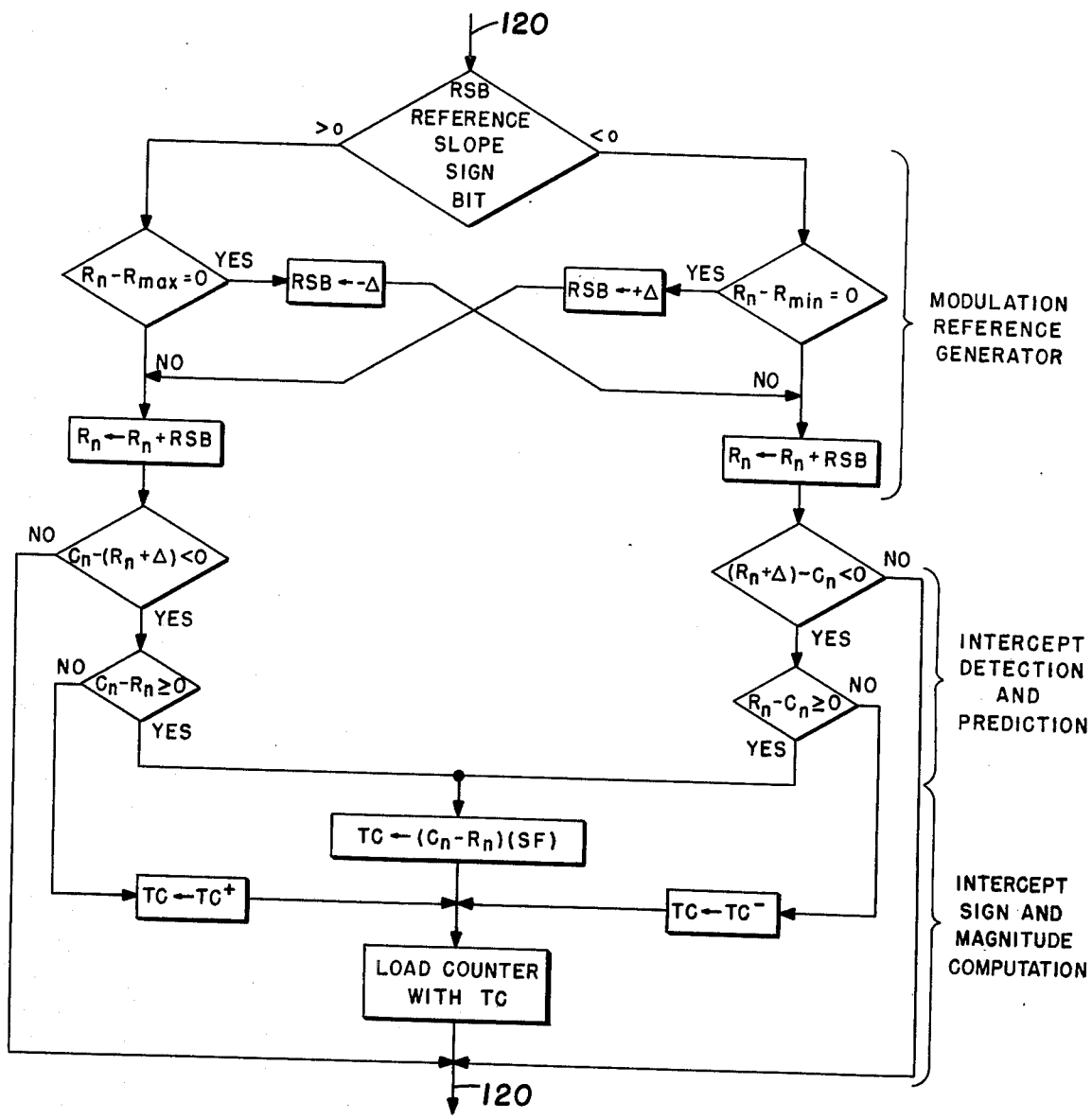
FIG. 8 is a logical flow chart which outlines the steps of the method of the present invention.

Referring now to FIG. 8, which is a flow chart of the method of the present invention, it can be seen to consist of two legs which relate to the positive and negative slopes of the ramp modulation reference wave. The first function of the method is to develop an incremental modulation reference such that its value at each increment is known. Assuming a portion of a conventional incremental ramp wave is entered at point 120, the first step is to generate a slope sign bit, this will indicate if the ramp is increasing or decreasing in value. Depending upon the slope of the wave at that instant, the ramp value $R_n$ will be compared to either the highest ramp value $R_{max}$ or the lowest ramp value $R_{min}$. If either end point has been reached then the signal will be incremented (or decremented) one step ($\Delta$) and crossed over to the opposite leg of the flow chart corresponding to either positive or negative slope. As indicated in FIG. 7 the next step after $R_n$ is $R_n + 1$. If a maximum or minimum value has not been reached then the reference slope sign bit is added to the ramp value $R_n$. This is generally accomplished by replacing $R_n$ with $R_n$ plus the reference slope sign bit. The modulation reference has now been generated in such a way that the value at any step is known and the slope direction at that value is also known.

It is now desired to determine if an intercept has occurred or will occur between the two waves. The ramp amplitude increment ($\Delta$) is added to the ramp amplitude $R_n$ and compared with the value of the digital command signal ($C_n$). In the positive slope leg, if the command signal minus the ramp wave value plus the amplitude increment, $C_n - (R_n + \Delta)$, is not less than zero then the remainder of the loop is circumvented and the method is begun again. Note that this NO signal is shown at the bottom as arrow 120 which is the same as the input arrow 120 at the start of this method. If $C_n - (R_n + \Delta)$ is less than zero then the next step is to determine if the command signal $C_n$ minus the ramp value $R_n$ is greater than or equal to zero, if not then the computed tail command or control surface command TC takes the value of an immediate tail command in the positive direction TC +. Since this preferred embodiment was intended for use in a guided missile environment, with the modulated data signal driving movable tail fins, the notation TC representing a tail command has been retained. If $C_n - R_n$ is greater than or equal to zero then the computed tail command TC is replaced by the command signal $C_n$ minus the ramp value $R_n$ times a predetermined scale factor SF, $(C_n - R_n) \times SF$. This scale factor SF is arrived at as follows:

$$SF = f/f_c/R_{max} - R_{min} \qquad (3)$$

where: $R_{max} - R_{min}$ is the peak-to-peak value of the ramp wave, $f_c$ is the computation frequency, and $f$ is the clock frequency of the correction counter. This computed tail command TC is then used by the correction counter to time the correct time to intercept.

The comparisons between $C_n$ and $R_n + \Delta$ and between $C_n$ and $R_n$ act as intercept detections and predictions, i.e., does the command signal lie between the ramp value under consideration and the ramp value plus an amplitude increment? It should be noted that a value not yet reached is checked first, that is, $R_n + \Delta$ is first examined and if the command signal is found to be less than that value then the command signal is compared to the ramp value at $R_n$ without the previous increment $\Delta$. At the first decision stage in this intercept detection and prediction test, provision is made to return to the beginning if an intercept will not occur within that increment. At the second decision of this test provision is made to determine the sign of the computed command, that is, to determine if a leading or lagging edge of the pulse has been detected. The magnitude and hence the pulse width error correction is then determined in the following step.

The correction counter 42 of FIG. 2 is not shown in more detail in FIG. 9. This special purpose digital output device is loaded with an $(n + 1)$ bit number whenever intercept is computed by the general purpose computer 40 of FIG. 2 using the flow diagram of FIG. 8. A sign bit is required to determine switching direction and an n-bit number is needed to divide the sampling interval into $2^n$ parts. A load command signal from a digital autopilot or the like on line 200 is used to load a direction flip-flop 202 and a binary pre-settable counter 204. The load command on line 200 is also fed to a control flip-flop 206 having a SET output on line 208 which is fed to a gate device 210. A second input to the gate device 210 is supplied by a clock on line 212. The gate device output signal on line 214 is fed to the pre-settable counter 204 and serves to start the counting. The clock signal on line 212 has a frequency given by $2^n f_c$ and is synchronous with the load command on line 200. At the completion of the count of the Up-Counter 204 (1111), a command flip-flop 216 is set to the state determined by the direction flip-flop 202 and will produce the pulse width modulated tail command on line 43.

As mentioned previously, many applications needing a digitally produced pulse width modulation waveform have a general purpose digital computer available, and this method is ideally suited for implementation by such computer. Moreover, because of the very few decisional steps in the method of this invention a special purpose logic circuit could easily be constructed to accomplish this method.

Various other modifications, adaptations, and alterations are of course possible in light of the above teachings. It should therefore be understood at this time that within the scope of the appended claims the invention may be practiced otherwise than is specifically described hereinabove.

What is claimed is:

1. A method for producing a binary pulse width modulated output signal from an amplitude modulated digital data signal having a fixed frequency in accordance with detected times of interception between said digital data signal and a reference signal, said method comprising the steps of: generating with means said reference signal in the form of uniform amplitude incrementations each of constant time interval to approximate as linear analog ramp signal, and having selected maximum and minimum amplitudes, comparing with means the value of said digital data signal at a selected interval to the values of said incremental reference signal at a first interval and a second subsequent interval for detecting if said data signal and said reference signal will intercept when said reference signal is incremented between the values corresponding to said first and said second subsequent intervals of said reference signal, generating with means a correction signal whose value is proportional to the time interval between the beginning of said first interval of said reference signal and the time at which said digital data signal would intercept said approximated linear analog ramp signal if an intercept between said digital data signal and said reference waveform upon incrementation to the value corresponding to said second interval is detected, and controlling with means the transition time of said binary pulse width modulated output signal from one binary state to its other binary state at each intercept depending upon the value of said proportional correction signal.

2. The method specified in claim 1 wherein the step of controlling the transition time of said binary pulse width modulated output signal further comprises the steps of:
utilizing said proportional correction signal to preset a timing circuit means to a corresponding timing condition,
timing out with said timing circuit means a control time interval commencing at the beginning of said first interval of said incremented reference signal and terminating at a time dependent upon the value of said proportional correction signal, and
utilizing the timing circuit means to control said binary pulse width modulated output signal to undergo a transition between its binary states at the end of said control time interval.

3. The method specified in claim 1 wherein the step of generating said incremented reference signal includes the steps of:
detecting when said reference signal upon being incremented reaches its selected maximum or minimum amplitude, and
changing the direction of incrementation of said reference signal when said maximum or minimum is detected.

4. The method specified in claim 1 wherein
the step of comparing the value of said digital data signal to the values of said incremental reference signal at said first and second intervals is performed for the second interval prior to being performed for the first interval, and
the step of generating said reference signal includes the step of immediately incrementing said reference signal if said comparison step reveals that said digital data signal will not intercept said reference signal between said first and second intervals.

* * * * *